United States Patent
Byeon

(10) Patent No.: US 9,917,061 B2
(45) Date of Patent: Mar. 13, 2018

(54) SEMICONDUCTOR APPARATUS AND MEMORY SYSTEM

(71) Applicant: SK hynix Inc., Icheon-si, Gyeonggi-do (KR)

(72) Inventor: Sang Jin Byeon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 267 days.

(21) Appl. No.: 14/014,625

(22) Filed: Aug. 30, 2013

(65) Prior Publication Data

US 2014/0344613 A1   Nov. 20, 2014

(30) Foreign Application Priority Data

May 20, 2013   (KR) .................. 10-2013-0056418

(51) Int. Cl.
| | |
|---|---|
| *G11C 5/06* | (2006.01) |
| *G06G 1/12* | (2006.01) |
| *H01L 23/544* | (2006.01) |
| *H01L 25/065* | (2006.01) |
| *G11C 8/12* | (2006.01) |
| *G11C 29/44* | (2006.01) |

(52) U.S. Cl.
CPC ........ *H01L 23/544* (2013.01); *H01L 25/0657* (2013.01); *G11C 8/12* (2013.01); *G11C 2029/4402* (2013.01); *H01L 2223/5444* (2013.01); *H01L 2223/54473* (2013.01); *H01L 2225/06527* (2013.01); *H01L 2924/0002* (2013.01)

(58) Field of Classification Search
CPC ...... G06F 1/12; H01L 23/544; H01L 25/0657

USPC ........................................ 713/500
See application file for complete search history.

(56) References Cited

U.S. PATENT DOCUMENTS

| | | | |
|---|---|---|---|
| 2009/0020855 A1* | 1/2009 | Pyeon | G11C 5/02 257/621 |
| 2010/0185841 A1* | 7/2010 | Monreal | G06F 13/4068 713/2 |
| 2010/0195364 A1* | 8/2010 | Riho | G11C 5/02 365/63 |
| 2011/0050320 A1* | 3/2011 | Gillingham | 327/365 |
| 2011/0079924 A1* | 4/2011 | Suh | G11C 5/00 257/777 |
| 2011/0148469 A1* | 6/2011 | Ito et al. | 327/77 |
| 2011/0194326 A1 | 8/2011 | Nakanishi et al. | |
| 2011/0241763 A1* | 10/2011 | Ko | G11C 8/12 327/526 |

(Continued)

FOREIGN PATENT DOCUMENTS

CN   102208211 A   10/2011

*Primary Examiner* — Idriss N Alrobaye
*Assistant Examiner* — Brooke Taylor
(74) *Attorney, Agent, or Firm* — William Park & Associates Ltd.

(57) ABSTRACT

A semiconductor apparatus includes a chip ID generation unit, a chip ID transmission unit and a chip stack information generation unit. The chip ID generation unit is configured to generate a chip ID signal. The chip ID transmission unit is configured to output the chip ID signal to a common line on the basis of whether another chip is electrically coupled therewith. The chip stack information generation unit is configured to be electrically coupled with the common line in response to the chip ID signal and generate a stack information signal.

11 Claims, 8 Drawing Sheets

(56) References Cited

U.S. PATENT DOCUMENTS

| | | | | |
|---|---|---|---|---|
| 2011/0260331 A1* | 10/2011 | Lee | ............................... | 257/774 |
| 2012/0126848 A1* | 5/2012 | Wu | ......................... | G11C 5/02 |
| | | | | 326/21 |
| 2012/0267776 A1* | 10/2012 | Nin | ............................... | 257/737 |
| 2014/0062587 A1* | 3/2014 | Koyanagi | ................ | G11C 8/12 |
| | | | | 327/595 |
| 2014/0205056 A1* | 7/2014 | Yamamoto | ........... | G11C 7/1051 |
| | | | | 377/54 |

* cited by examiner

SEMICONDUCTOR APPARATUS AND MEMORY SYSTEM

CROSS-REFERENCES TO RELATED APPLICATION

The present application claims priority under 35 U.S.C. § 119(a) to Korean application number 10-2013-0056418, filed on May 20, 2013, in the Korean Intellectual Property Office, which is incorporated herein by reference in its entirety.

BACKGROUND

1. Technical Field

Various embodiments relate to a semiconductor apparatus, and more particularly, to a 3D (three-dimensional) semiconductor apparatus in which a plurality of chips are stacked, and a memory system.

2. Related Art

In order to improve the degree of integration of a semiconductor apparatus, a 3D (three-dimensional) semiconductor apparatus, in which a plurality of chips are stacked and packaged in a single package, has been developed. Recently, a TSV (through-silicon via) type semiconductor apparatus has been disclosed in the art, in which through-silicon vias are formed to pass through a plurality of stacked chips such that all the chips are electrically coupled with one another.

The 3D semiconductor apparatus includes a plurality of TSVs so that the plurality of stacked chips may commonly receive various signals through the TSVs. For example, in the case of a memory apparatus, a plurality of stacked chips commonly receive address signals, signals for various tests, signals of input/output lines and command signals through TSVs. It is the norm that a 3D semiconductor apparatus includes a logic die which relays communication between an external controller and stacked chips.

In the course of manufacturing a semiconductor, it is advantageous in terms of cost to manufacture chips with the same structure. Accordingly, it is important to develop a chip having a structure which may be commonly used in a general semiconductor apparatus in which a single chip is packaged and a 3D semiconductor apparatus. As a chip having a structure with high compatibility is developed in order to match all kinds of stacking schemes, circuits which do not need to operate and signals which do not need to be used may exist according to the number of chips to be stacked. For example, it is assumed that each of semiconductor chips has a structure which includes pins and buffers for receiving 4 chip select signals to be capable of matching all kinds of stacked semiconductor apparatuses. In this case, while 4 chip select signals are needed in a semiconductor apparatus in which 4 chips are stacked, in a semiconductor apparatus in which 2 chips are stacked, it is sufficient to use only 2 chip select signals. Accordingly, it is efficient to deactivate pin and buffer circuits which receive 2 chip select signals not used. Thus, in order to efficiently control a semiconductor apparatus, it is important to determine what number of chips are stacked to constitute a currently used semiconductor apparatus.

SUMMARY

A semiconductor apparatus which generates information on the number of stacked chips and efficiently operates using the information and a memory system are described herein.

In an embodiment of the present invention, a semiconductor apparatus may include: a chip ID generation unit configured to generate a chip ID signal; a chip ID transmission unit configured to output the chip ID signal to a common line on the basis of whether another chip is electrically coupled therewith; and a chip stack information generation unit configured to be electrically coupled with the common line in response to the chip ID signal and generate a stack information signal.

In an embodiment of the present invention, a semiconductor apparatus has stacked therein a plurality of chips which include a first chip stacked at a first stage and a second chip stacked at a last stage, wherein the plurality of chips may include chip ID generation units which are respectively disposed in the plurality of chips, are sequentially electrically coupled with one another and generate a plurality of chip ID signals, and wherein the first chip may be configured to receive the chip ID signal of the second chip and generate a stack information signal from the chip ID signal of the second chip.

In an embodiment of the present invention, a memory system may include: a memory device including one or more memory chips and configured to generate a stack information signal for the number of stacked memory chips; and a controller including a plurality of control circuits for providing control signals to the one or more memory chips, the control circuits being enabled in response to the stack information signal.

In an embodiment of the present invention, a semiconductor apparatus having stacked therein a plurality of chips which include a first chip stacked with a second chip, wherein the plurality of chips include chip ID generation units which are respectively disposed in the plurality of chips, are sequentially electrically coupled with one another and generate a plurality of chip ID signals, wherein the chip ID generation unit of the first chip is electrically coupled with a power supply voltage, and wherein the first chip is configured to receive the chip ID signal of the second chip and generate a stack information signal from the chip ID signal of the second chip.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a memory system according to the present invention will be described below with reference to the accompanying drawings through various embodiments.

Figure 1:
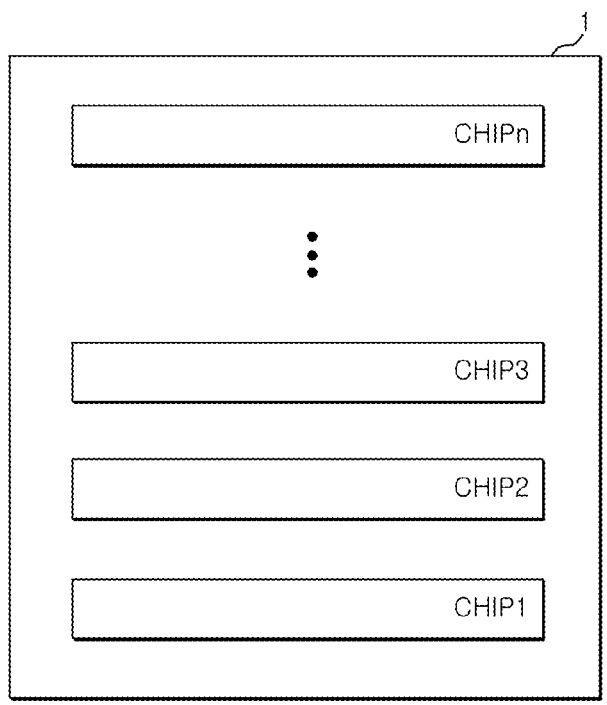
FIG. 1 is a diagram schematically showing the configuration of a semiconductor apparatus in accordance with an embodiment.

In FIG. 1, a semiconductor apparatus 1 may include a plurality of chips CHIP1 to CHIPn. The plurality of chips CHIP1 to CHIPn may constitute a single 3D semiconductor apparatus by being stacked upon one another and then packaged into one package. The chips CHIP1 to CHIPn may be, for example, memory chips. The plurality of chips CHIP1 to CHIPn may be chips which have the same structure or may be chips which have partially different structures. For instance, in the case where the plurality of chips CHIP1 to CHIPn has the same structure, the semiconductor apparatus 1 may be referred to as a homogeneous type semiconductor apparatus. Also, in FIG. 1, the lowermost stacked chip among the plurality of chips CHIP1 to CHIPn may have a structure different from the other chips stacked thereon, and in this case, the semiconductor apparatus 1 may be referred to as a heterogeneous type semiconductor apparatus. In the heterogeneous type semiconductor apparatus, the first stacked chip may be referred to as a master chip or a logic chip and may play the role of relaying communication between the other chips stacked thereon and an external controller. While FIG. 1 shows the semiconductor apparatus 1 of a type in which the plurality of chips CHIP1 to CHIPn are vertically stacked, the present invention is not limited such, and the spirit of the present invention may be sufficiently applied to a semiconductor apparatus of a type in which a plurality of chips are stacked in a horizontal direction.

Figure 2:
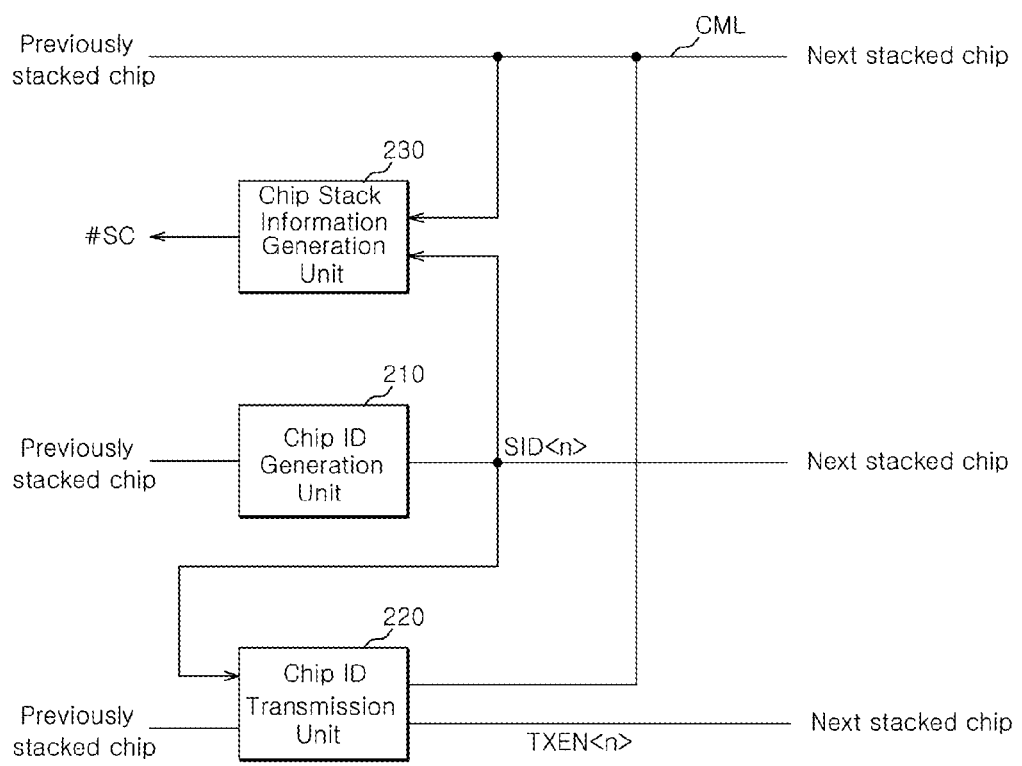
FIG. 2 is a diagram schematically showing the configuration of an example of an embodiment of one of chips which constitute the semiconductor apparatus shown in FIG. 1.

FIG. 2 is a diagram schematically showing the configuration of an example of an embodiment of one of the chips which constitute the semiconductor apparatus 1 shown in FIG. 1. In FIG. 2, a chip 2 may include a chip ID generation unit 210, a chip ID transmission unit 220, and a chip stack information generation unit 230. Each of the chips CHIP1 to CHIPn shown in FIG. 1 may include the configuration shown in FIG. 2. The chip ID generation unit 210 may be configured to generate a chip ID signal SID<n> of the chip 2. The chip ID generation unit 210 may have an input terminal which is electrically coupled with a previously stacked chip and an output terminal which is electrically coupled with a next stacked chip. In the case where the chip 2 is the first stacked chip of FIG. 1, the input terminal of the chip ID generation unit 210 may receive, for example, a power supply voltage. Further, in the case where the chip 2 is the last stacked chip of FIG. 1, the output terminal of the chip ID generation unit 210 may be floated.

The chip ID generation unit 210 may generate the chip ID signal SID<n> by increasing or decreasing the logic value of a plurality of codes. For example, in the case where the chip ID generation unit 210 receives a signal with the value of 0011 from the previously stacked chip, the chip ID generation unit 210 may generate the chip ID signal SID<n> with the logic value 0100 or 0010 by increasing or decreasing the code value. Of course, an increment or a decrement by which the code value is increased or decreased may be not only 1 but also 2 or more. As will be described later, since the chip ID generation units of the chips CHIP1 to CHIPn may be sequentially electrically coupled in series, the chip ID generation units may provide different chip ID signals to the respective chips CHIP1 to CHIPn.

The chip ID transmission unit 220 may be configured to receive the chip ID signal SID<n> from the chip ID generation unit 210. The chip ID transmission unit 220 outputs the chip ID signal SID<n> received from the chip ID generation unit 210 to a common line CML, on the basis of whether the chip ID transmission unit 220 is electrically coupled with another chip. That is to say, the chip ID transmission unit 220 may output the chip ID signal SID<n> to the common line CML on the basis of whether a stacked chip exists on the chip 2 or not. As will be described later is detail, the chip ID transmission unit 220 may output the chip ID signal SID<n> to the common line CML according to whether the output terminal of the chip ID transmission unit 220 is electrically coupled with the chip ID transmission unit disposed in the next stacked chip.

In the case where the chip ID transmission unit 220 is electrically coupled with another chip, the chip ID transmission unit 220 may block the chip ID signal SID<n> from being outputted to the common line CML, and in the case where the chip ID transmission unit 220 is not electrically coupled with another chip, the chip ID transmission unit 220 may output the chip ID signal SID<n> to the common line CML. The chip ID transmission unit 220 generates a transmission enable signal TXEN<n> on the basis of whether the chip ID transmission unit 220 is electrically coupled with another chip. The transmission enable signal TXEN<n> will be described later in detail.

The chip stack information generation unit 230 may be configured to receive the chip ID signal SID<n> from the chip ID generation unit 210. The chip stack information generation unit 230 is electrically coupled with the common line CML. The chip stack information generation unit 230 may be enabled in response to the chip ID signal SID<n>. For example, the chip stack information generation unit 230 may be enabled in the case where the chip ID signal SID<n> is a code signal with a predetermined logic value. The chip stack information generation unit 230 is electrically coupled with the common line CML when being enabled. When the chip stack information generation unit 230 is electrically coupled with the common line CML, the chip stack information generation unit 230 may receive the chip ID signal SID<n> transmitted through the common line CML and generate a stack information signal #SC.

Figure 3:
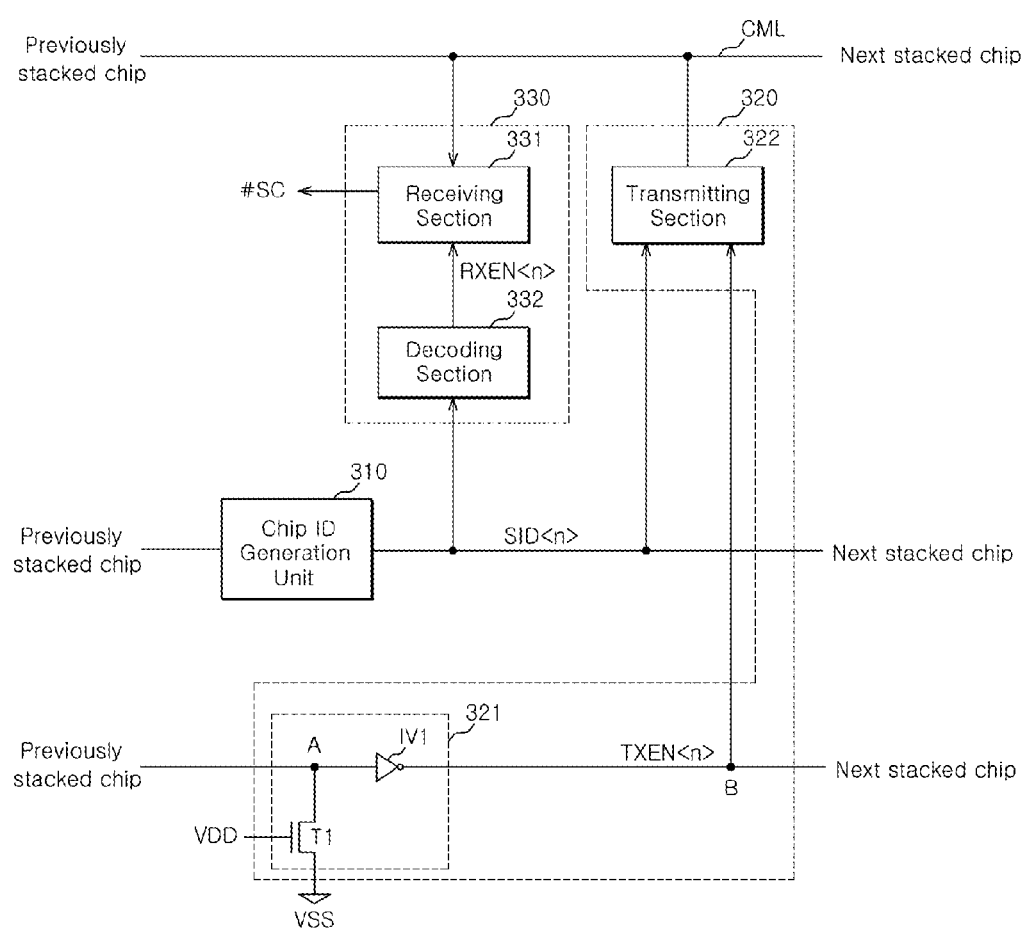
FIG. 3 is a block diagram showing the detailed configuration of a semiconductor apparatus in accordance with an embodiment.

FIG. 3 is a block diagram showing the detailed configuration of a semiconductor apparatus 3 in accordance with an embodiment. In FIG. 3, a chip ID generation unit 310 may have an input terminal which is electrically coupled with a previously stacked chip and an output terminal which is electrically coupled with a next stacked chip. A common line CML may be electrically coupled commonly with the previously stacked chip, the semiconductor apparatus 3 and the next stacked chip.

A chip ID transmission unit 320 may have an input terminal which is electrically coupled with the previously stacked chip and an output terminal which is electrically coupled with the next stacked chip. Also, the chip ID transmission unit 320 is electrically coupled with the common line CML. The chip ID transmission unit 320 may include a determining section 321 and a transmitting section 322. The determining section 321 may be configured to generate a transmission enable signal TXEN<n> on the basis of whether or not the output terminal thereof is electrically coupled with another chip. The determining section 321 may disable the transmission enable signal TXEN<n> in the case where the output terminal thereof is electrically coupled with another chip, and may enable the transmission enable signal TXEN<n> in the case where the output terminal thereof is not electrically coupled with another chip.

In FIG. 3, the determining section 321 includes a first transistor T1 and a first inverter IV1. The first transistor T1 may have a gate which receives a control signal, and a drain and a source one of which is electrically coupled with a ground voltage VSS and the other of which is electrically coupled with a first node A. The first node A is electrically coupled with the previously stacked chip and the input terminal of the first inverter IV1. As the control signal, a power supply voltage VDD may be used.

The first inverter IV1 has the input terminal which is electrically coupled with the first node A and an output terminal which is electrically coupled with a second node B. The first inverter IV1 inverts the signal inputted from the first node A and outputs a resultant signal to the second node B.

The transmitting section 322 may be configured to receive the transmission enable signal TXEN<n> and a chip ID signal SID<n>. The transmitting section 322 may output the chip ID signal SID<n> to the common line CML when the transmission enable signal TXEN<n> is enabled.

A chip stack information generation unit 330 may be electrically coupled with the common line CML in response to the chip ID signal SID<n>, and may be configured to generate a stack information signal #SC from the chip ID signal SID<n> transmitted through the common line CML. The chip stack information generation unit 330 may include a receiving section 331. The receiving section 331 may be electrically coupled with the common line CML in response to a reception enable signal RXEN<n> which is generated on the basis of the chip ID signal SID<n>. The receiving section 331 generates the stack information signal #SC from the chip ID signal SID<n> which are transmitted through the common line CML, when being electrically coupled with the common line CML in response to the reception enable signal RXEN<n>.

The chip stack information generation unit 330 may further include a decoding section 332. The decoding section 332 may be configured to decode the chip ID signal SID<n> and generate the reception enable signal RXEN<n>.

Figure 4:
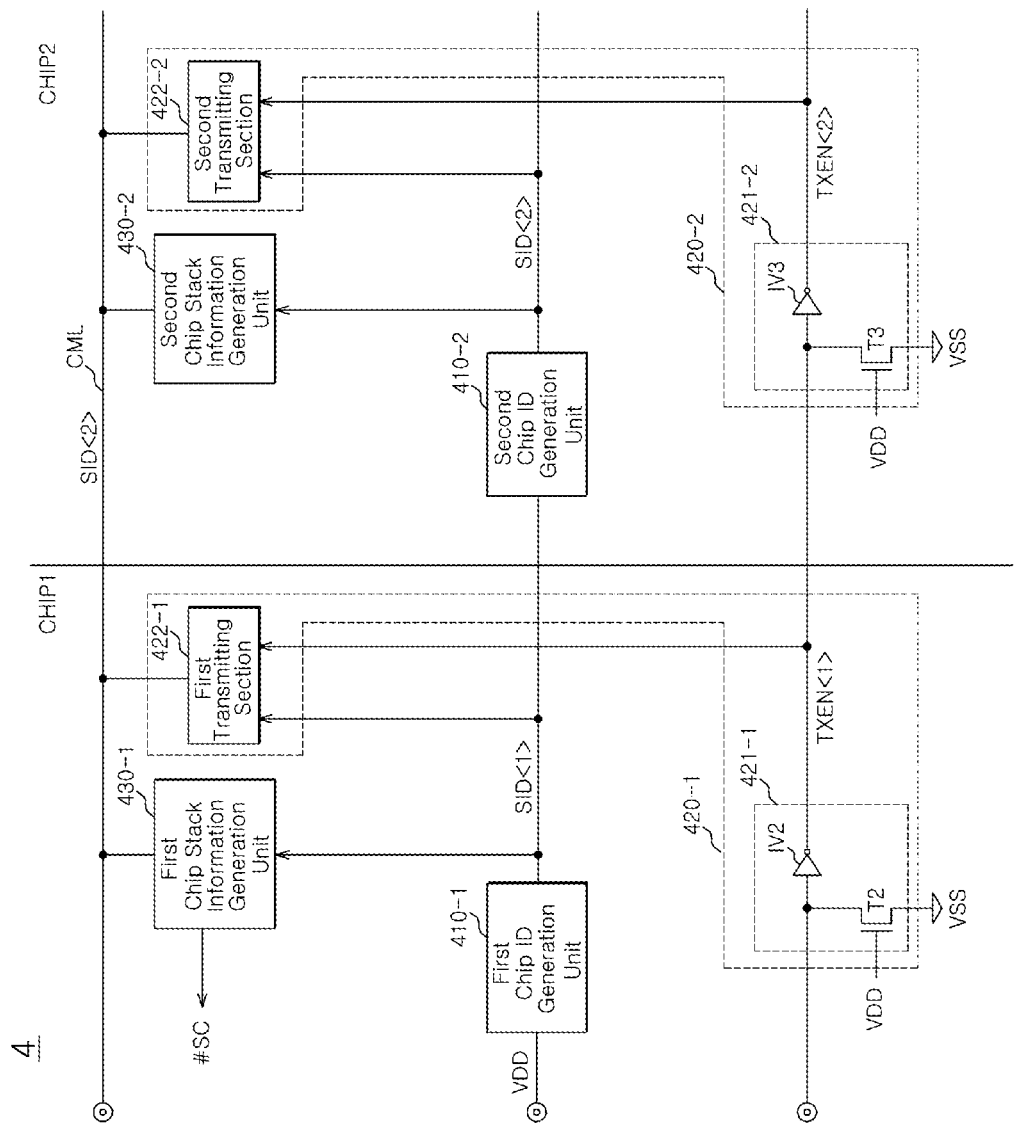
FIG. 4 is a block diagram schematically showing the configuration of a semiconductor apparatus in accordance with an embodiment in which 2 chips are stacked.

FIG. 4 is a block diagram schematically showing the configuration of a semiconductor apparatus 4 in accordance with an embodiment in which 2 chips are stacked. The semiconductor apparatus 4 includes a first chip CHIP1 and a second chip CHIP2. Each of the first and second chips CHIP1 and CHIP2 has the same configuration as the semiconductor apparatus 3 of FIG. 3. The first chip CHIP1 includes a first chip ID generation unit 410-1, a first chip ID transmission unit 420-1 and a first chip stack information generation unit 430-1, and the second chip CHIP2 includes a second chip ID generation unit 410-2, a second chip ID transmission unit 420-2 and a second chip stack information generation unit 430-2. A common line CML is electrically coupled commonly with the first and second chips CHIP1 and CHIP2.

The first chip ID generation unit 410-1 and the second chip ID generation unit 410-2 are sequentially electrically coupled with each other. Since the first chip CHIP1 is stacked at the first stage, the input terminal of the first chip ID generation unit 410-1 may be electrically coupled with a power supply voltage VDD. The output terminal of the first chip ID generation unit 410-1 is electrically coupled with the input terminal of the second chip ID generation unit 410-2. Since the second chip CHIP2 is stacked at the last stage, the output terminal of the second chip ID generation unit 410-2 may have no electrical coupling and may be floated. Because the first chip ID generation unit 410-1 and the second chip ID generation unit 410-2 are sequentially electrically coupled with each other, the first chip ID generation unit 410-1 and the second chip ID generation unit 410-2 may provide different chip ID signals to the first and second chips CHIP1 and CHIP2, respectively. For example, when the first chip ID generation unit 410-1 receives the power supply voltage VDD and outputs a signal with the logic value of 001 as a first chip ID signal SID<1>, the second chip ID generation unit 410-2 may receive the first chip ID signal SID<1> with the logic value of 001 and output a signal with the logic value 010 as a second chip ID signal SID<2>.

The first chip ID transmission unit 420-1 and the second chip ID transmission unit 420-2 are also sequentially electrically coupled with each other. The first chip ID transmission unit 420-1 includes a first determining section 421-1 and a first transmitting section 422-1, and the second chip ID transmission unit 420-2 includes a second determining section 421-2 and a second transmitting section 422-2. The first determining section 421-1 may have an input terminal which does not have any electrical coupling and an output terminal which is electrically coupled with the input terminal of the second determining section 421-2. The first determining section 421-1 may include a second transistor T2 and a second inverter IV2, and the second determining section 421-2 may include a third transistor T3 and a third inverter IV3. The second and third transistors T2 and T3 perform the same function as the first transistor T1 of FIG. 3, and the second and third inverters IV2 and IV3 perform the same function as the first inverter IV1 of FIG. 3.

The output terminal of the second inverter IV2 may be electrically coupled with the input terminal of the third inverter IV3 and the third transistor T3. The second transistor T2 outputs a signal with a first level in response to a control signal, and the second inverter IV2 inverts the signal with the first level and outputs a signal with a second level. Since the third transistor T3 drives the output terminal of the second inverter IV2 to the first level in response to the control signal, a first transmission enable signal TXEN<1> becomes the first level. In other words, the first transmission enable signal TXEN<1> is disabled to the first level. The third inverter IV3 receives the output of the third transistor T3 and outputs a signal with the second level. Since the output terminal of the third inverter IV3 is not electrically coupled with another chip, a second transmission enable signal TXEN<2> may be enabled to the second level.

The first transmitting section 422-1 blocks the first chip ID signal SID<1> from being outputted to the common line CML, in response to the first transmission enable signal TXEN<n> which is disabled. The second transmitting section 422-2 outputs the second chip ID signal SID<2> to the common line CML in response to the second transmission enable signal TXEN<2> which is enabled.

The first chip stack information generation unit 430-1 and the second chip stack information generation unit 430-2 may be enabled in response to a signal with a predetermined logic value, as described above. The signal with the predetermined logic value may be the first chip ID signal SID<1>. Namely, the first and second chip stack information generation units 430-1 and 430-2 may be enabled by only a signal with the same logic value as the first chip ID signal SID<1>. Accordingly, the first chip stack information generation unit 430-1 is enabled in response to the first chip ID signal SID<1>, and the second chip stack information generation unit 430-2 is disabled since it receives the second chip ID signal SID<2>.

The first chip stack information generation unit 430-1 is electrically coupled with the common line CML and receives the second chip ID signal SID<2> which is transmitted through the common line CML. The first chip stack information generation unit 430-1 generates a stack information signal #SC by receiving the second chip ID signal SID<2> from the common line CML. Due to the fact that the first chip stack information generation unit 430-1 generates the stack information signal #SC on the basis of the second chip ID signal SID<2>, the stack information signal #SC may have information that the number of chips stacked to constitute the semiconductor apparatus 4 is two.

Figure 5:
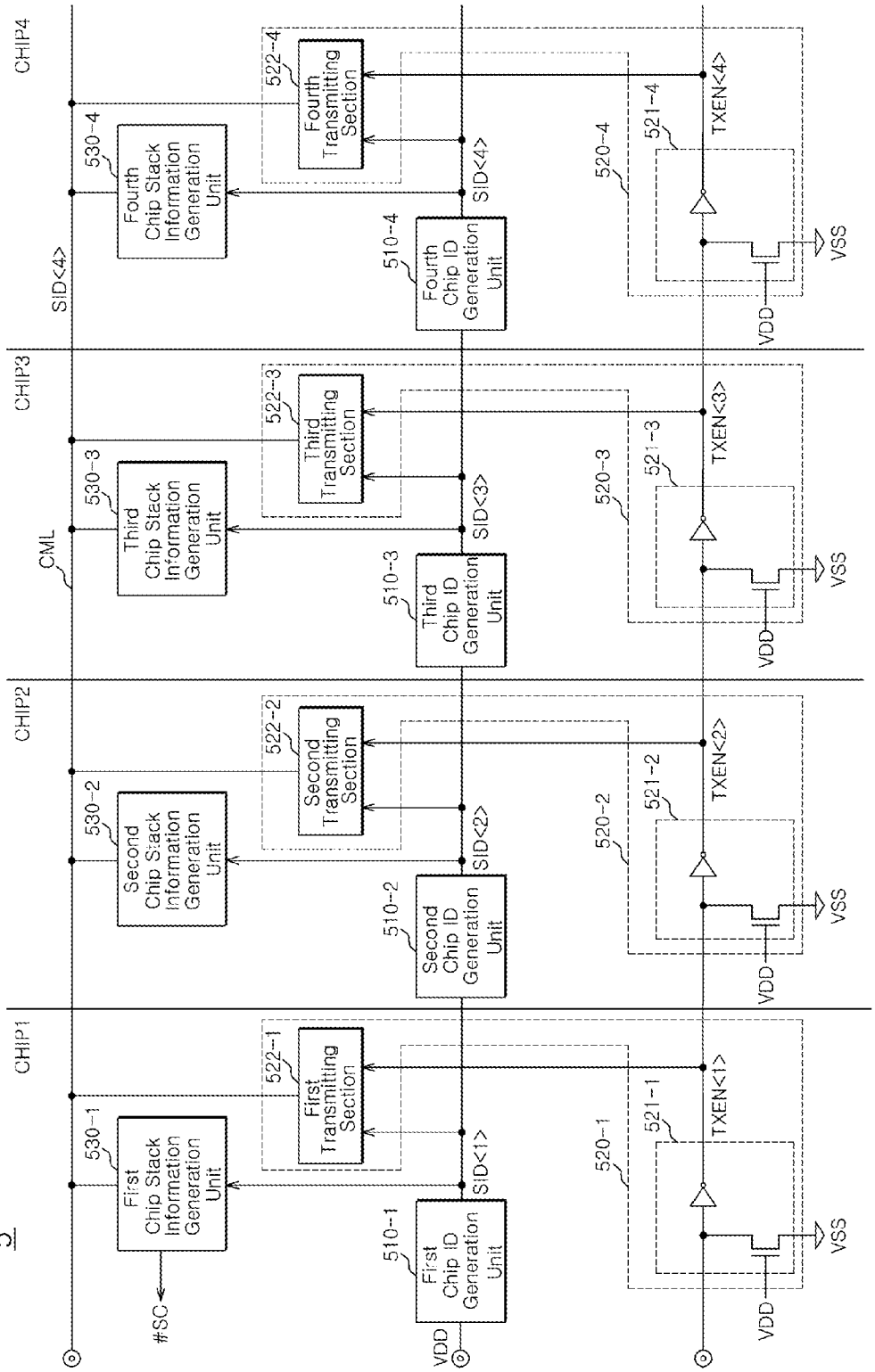
FIG. 5 is a diagram showing the configuration of a semiconductor apparatus in accordance with an embodiment in which 4 chips are stacked.

FIG. 5 is a diagram showing the configuration of a semiconductor apparatus 5 in accordance with an embodiment in which 4 chips are stacked. In FIG. 5, the semiconductor apparatus 5 includes first to fourth chips CHIP1, CHIP2, CHIP3 and CHIP4. The first to fourth chips CHIP1, CHIP2, CHIP3 and CHIP4 are sequentially stacked upon one another. The first chip CHIP1 is stacked at the first stage, and the fourth chip CHIP4 is stacked at the last stage. The first to fourth chips CHIP1 to CHIP4 have the same configuration as the semiconductor apparatus 3 of FIG. 3. The first chip CHIP1 includes a first chip ID generation unit 510-1, a first chip ID transmission unit 520-1 and a first chip stack information generation unit 530-1. The second chip CHIP2 includes a second chip ID generation unit 510-2, a second chip ID transmission unit 520-2 and a second chip stack information generation unit 530-2. The third chip CHIP3 includes a third chip ID generation unit 510-3, a third chip ID transmission unit 520-3 and a third chip stack information generation unit 530-3. In the same manner, the fourth chip CHIP4 includes a fourth chip ID generation unit 510-4, a fourth chip ID transmission unit 520-4 and a fourth chip stack information generation unit 530-4.

The first to fourth chip ID generation units 510-1, 510-2, 510-3 and 510-4 may be sequentially electrically coupled with one another and may respectively generate first to fourth chip ID signals SID<1>, SID<2>, SID<3> and SID<4> with different logic values. The input terminal of the first chip ID generation unit 510-1 receives a power supply voltage VDD, the input terminals of the second and third chip ID generation units 510-2 and 510-3 are respectively electrically coupled with the output terminals of the chip ID generation units 510-1 and 510-2 of the previously stacked first and second chips CHIP1 and CHIP2, and the output terminals of the second and third chip ID generation units 510-2 and 510-3 are respectively electrically coupled with the input terminals of the chip ID generation units 510-3 and 510-4 of the next stacked third and fourth chips CHIP3 and CHIP4. Since the fourth chip CHIP4 is the chip stacked at the last stage, the output terminal of the fourth chip ID generation unit 510-4 is floated.

The first to fourth chip ID transmission units 520-1, 520-2, 520-3 and 520-4 are sequentially electrically coupled with one another. The first chip ID transmission unit 520-1 includes a first determining section 521-1 and a first transmitting section 522-1. The second chip ID transmission unit 520-2 includes a second determining section 521-2 and a second transmitting section 522-2. The third chip ID transmission unit 520-3 includes a third determining section 521-3 and a third transmitting section 522-3. The fourth chip ID transmission unit 520-4 includes a fourth determining section 521-4 and a fourth transmitting section 522-4. Since the first to third chip ID transmission units 520-1, 520-2 and 520-3 are respectively electrically coupled with the next stacked chips CHIP2, CHIP3 and CHIP4, first to third transmission enable signals TXEN<1>, TXEN<2> and TXEN<3> which are generated from the first to third determining sections 521-1, 521-2 and 521-3 are all disabled to a first level. Since the fourth chip CHIP4 is stacked at the last stage and no chip is next stacked, the fourth determining section 521-4 enables a fourth transmission enable signal TXEN<4> to a second level. Accordingly, the first to third transmitting sections 522-1, 522-2 and 522-3 block the first to third chip ID signals SID<1>, SID<2> and SID<3> from being outputted to a common line CML, and the fourth transmitting section 522-4 outputs the fourth chip ID signal SID<4> to the common line CML.

The first chip stack information generation unit 530-1 may receive the first chip ID signal SID<1> and may be electrically coupled with the common line CML in response to the first chip ID signal SID<1>. The second to fourth chip stack information generation units 530-2, 530-3 and 530-4 may be disabled in response to the second to fourth chip ID signals SID<2>, SID<3> and SID<4>. Accordingly, the first chip stack information generation unit 530-1 receives the fourth chip ID signal SID<4> which is transmitted through the common line CML, and generates a stack information signal #SC on the basis of the fourth chip ID signal SID<4>. Since the stack information signal #SC is generated on the basis of the fourth chip ID signal SID<4>, the stack information signal #SC may have information that the number of chips stacked to constitute the semiconductor apparatus 5 is four.

As may be seen from the above descriptions, in the semiconductor apparatus 5 in accordance with the present embodiment, a chip ID signal of a last stacked chip may be transmitted to a common line, a first stacked chip may receive the chip ID signal of the last stacked chip through the common line, and a stack information signal may be generated from the chip ID signal of the last stacked chip.

Figure 6:
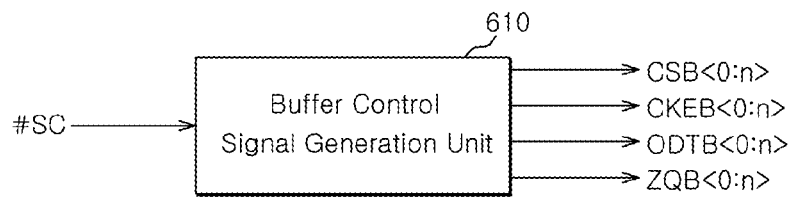
FIG. 6 is a block diagram schematically showing the configuration of a buffer control signal generation unit in accordance with an embodiment.

FIG. 6 is a block diagram schematically showing the configuration of a buffer control signal generation unit 610 in accordance with an embodiment. In FIG. 6, the buffer control signal generation unit 610 may be configured to receive a stack information signal #SC and generate a plurality of buffer control signals. The plurality of buffer control signals may include one or more of chip select buffer control signals CSB<0:n>, clock enable buffer control signals CKEB<0:n>, on-die termination buffer control signals ODTB<0:n> and ZQ calibration buffer control signals ZQB<0:n>. The buffer control signal generation unit 610 may determine whether to enable the plurality of buffer control signals, in response to the stack information signal #SC. For example, in the case where the stack information signal #SC has information that 2 chips are stacked, the buffer control signal generation unit 610 may enable 2 chip select buffer control signals CSB<0:1> among the total 4 chip select buffer control signals CSB<0:3> and may disable the remaining 2 chip select buffer control signals CSB<2:3>. The buffer control signal generation unit 610 may provide the plurality of buffer control signals to a controller, and may determine whether to enable control circuits which may be disposed in the controller, for example, chip select buffers, clock enable buffers, on-die termination buffers and ZQ calibration buffers.

Without a limiting sense, the buffer control signal generation unit 610 may be disposed in a chip which generates the stack information signal #SC. For instance, the buffer control signal generation unit 610 may be disposed in the first stacked chip among a plurality of stacked chips and may be disposed in a chip which performs the function of a logic chip.

Figure 7:
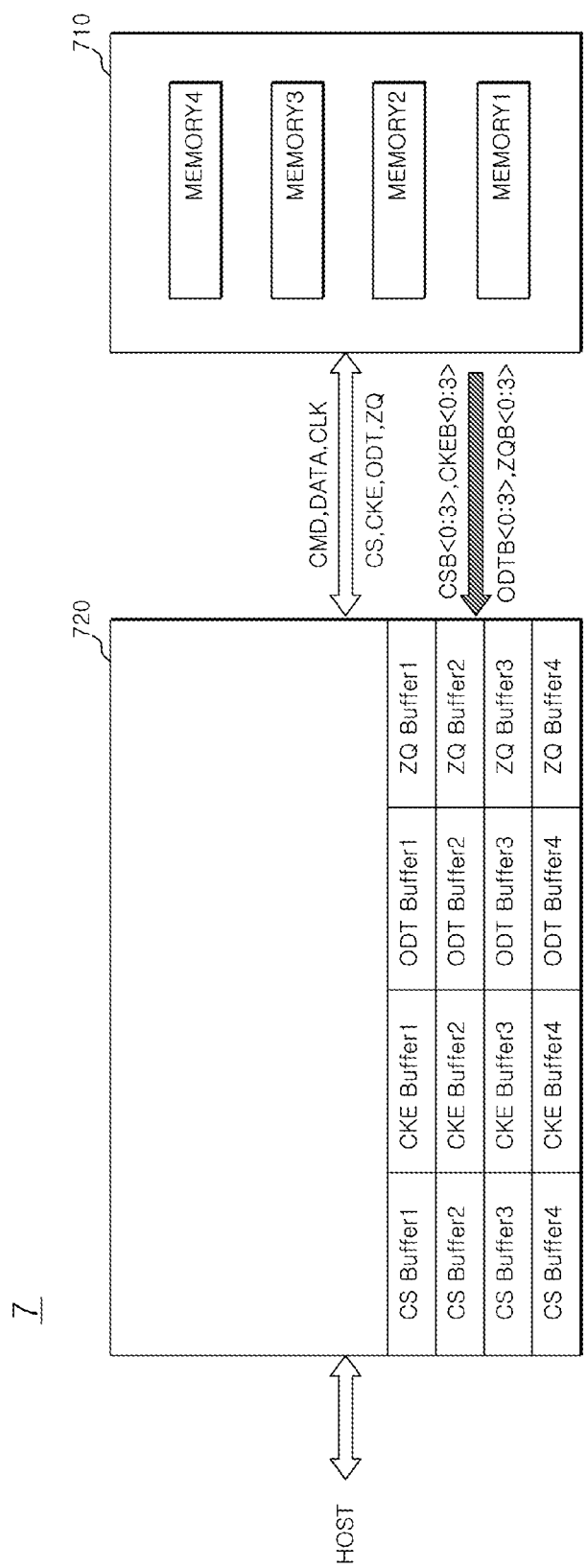
FIG. 7 is a diagram schematically showing the configuration of a semiconductor system in accordance with an embodiment.

FIG. 7 is a diagram schematically showing the configuration of a semiconductor system 7 in accordance with an embodiment. In FIG. 7, the semiconductor system 7 may include a memory device 710 and a controller 720. The memory device 710 may include a plurality of memory chips. The plurality of memory chips is stacked upon one another to constitute a single memory device. In FIG. 7, the memory device 710 includes first to fourth memory chips MEMORY1, MEMORY2, MEMORY3 and MEMORY4 which are stacked upon one another. Each of the first to fourth memory chips MEMORY1, MEMORY2, MEMORY3 and MEMORY4 has the configuration of the semiconductor apparatus 3 shown in FIG. 3. Accordingly, the memory device 710 may generate a stack information signal #SC which has information on the number of stacked memory chips. Further, the memory device 710 may include the buffer control signal generation unit 610 of FIG. 6 and generates a plurality of buffer control signals CSB<0:3>, CKEB<0:3>, ODTB<0:3> and ZQB<0:3> from the stack information signal #SC.

The controller 720 relays communication between a host HOST and the memory device 710. The controller 720 may generate a command signal CMD, data DATA and a clock signal CLK on the basis of the signals received from the host HOST and may provide the command signal CMD, the data DATA and the clock signal CLK to the memory device 710. Further, the controller 720 may provide one or more control signals to the memory device 710 to control the memory device 710. The controller 720 may include one or more control circuits for providing the one or more control signals to the memory device 710. For example, the control signals may include one or more of chip select signals CS, clock enable signals CKE, on-die termination signals ODT and ZQ calibration signals ZQ. For example, the control circuits may include one or more of chip select buffers CS buffer 1, CS buffer 2, CS buffer 3 and CS buffer 4, clock enable buffers CKE buffer 1, CKE buffer 2, CKE buffer 3 and CKE buffer 4, on-die termination buffers ODT buffer 1, ODT buffer 2, ODT buffer 3 and ODT buffer 4, and ZQ calibration buffers ZQ buffer 1, ZQ buffer 2, ZQ buffer 3 and ZQ buffer 4. These buffers may be selectively enabled in response to the buffer control signals CSB<0:3>, CKEB<0:3>, ODTB<0:3> and ZQB<0:3>. Enabled buffers may provide the chip select signals CS, the clock enable signals CKE, the on-die termination signals ODT and the ZQ calibration signals ZQ to the memory device 710.

While FIG. 7 exemplifies the case where the controller 720 includes 4 buffers for each kind, the present invention is not limited to such, and the number of buffers may be increased or decreased according to the compatibility of the controller 720. For instance, the controller 720 may include 8 clock enable buffers to operate compatibly with a memory device in which minimum 1 or maximum 8 chips may be stacked, and 8 chip select buffers may be selectively enabled according to the number of actually stacked memory chips.

Figure 8:
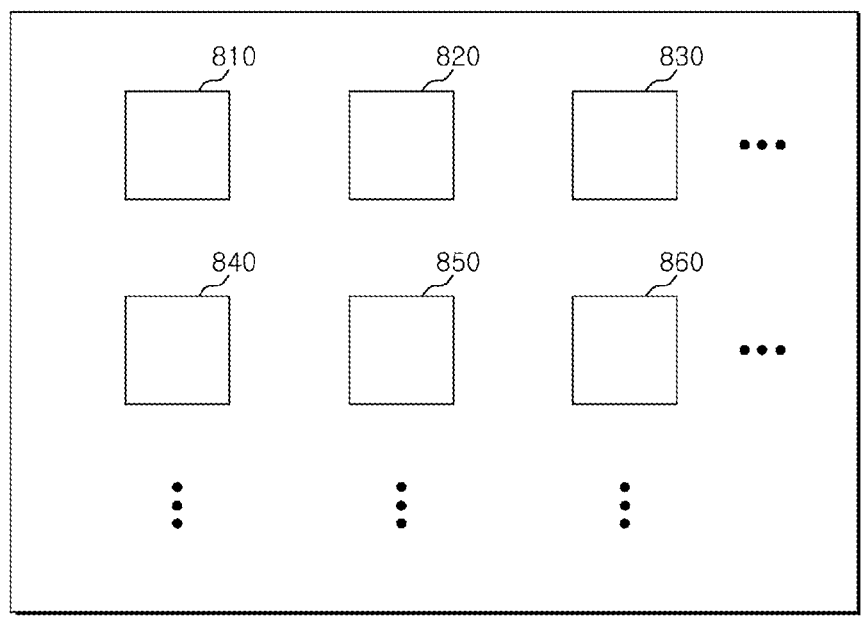
FIG. 8 is a diagram schematically showing the configuration of a semiconductor module in accordance with an embodiment.

FIG. 8 is a diagram schematically showing the configuration of a semiconductor module 8 in accordance with an embodiment. In FIG. 8, the semiconductor module 8 includes a plurality of semiconductor apparatuses 810 to 860. Each of the plurality of semiconductor apparatuses 810 to 860 may be a 3D semiconductor apparatus in which one or more chips are stacked upon one another. Moreover, each of the plurality of semiconductor apparatuses 810 to 860 may include the configuration of the semiconductor apparatus 3 shown in FIG. 3. The plurality of semiconductor apparatuses 810 to 860 may be electrically coupled with one another, and the semiconductor module 8 may automatically acquire information on what number of semiconductor apparatuses are used to constitute it. The semiconductor module 8 may receive stack information signals which are outputted from the plurality of semiconductor apparatuses 810 to 860, may acquire information on the numbers of chips which constitute the plurality of semiconductor apparatuses 810 to 860, and may use the information in efficiently controlling the plurality of semiconductor apparatuses 810 to 860.

While various embodiments have been described above, it will be understood to those skilled in the art that the embodiments described are by way of example only. Accordingly, the semiconductor apparatus and the memory system described herein should not be limited based on the described embodiments. Rather, the semiconductor apparatus and the memory system described herein should only be limited in light of the claims that follow when taken in conjunction with the above description and accompanying drawings.

What is claimed is:

1. A semiconductor apparatus comprising:
   a stacked chip comprising multiple chips;
   a non-first chip of the multiple chips further comprising:
      a chip ID generation unit configured to generate a chip ID signal;
      a chip ID transmission unit configured to output the chip ID signal to a common line when a next chip does not exist in the stacked chip; and
      a chip stack information generation unit configured to be electrically coupled with the common line in response to the chip ID signal and generate a stack information signal,
   wherein a first chip of the multiple chips is configured to directly receive the chip ID signal of the non-first chip when the next chip does not exist in the stacked chip, and
   wherein the chip ID transmission unit comprises:
      a determining section configured to generate a transmission enable signal on the basis of whether an output terminal thereof is electrically coupled with the the another stacked chip at the next stage; and
      a transmitting section configured to transmit the chip ID signal to the common line in response to the transmission enable signal.

2. The semiconductor apparatus according to claim 1, wherein the determining section disables the transmission enable signal in the case where the output terminal thereof is electrically coupled with the another stacked chip and enables the transmission enable signal in the case where the output terminal thereof is floated.

3. The semiconductor apparatus according to claim 2, wherein the determining section comprises:
   a transistor configured to generate a signal with a first voltage level in response to a control signal; and
   an inverter configured to receive the signal with the first voltage level and provide a signal with a second voltage level as the transmission enable signal.

4. The semiconductor apparatus according to claim 1, wherein the chip stack information generation unit generates the stack information signal from the chip ID signal which is transmitted through the common line, in response to a reception enable signal which is generated on the basis of the chip ID signal.

5. The semiconductor apparatus according to claim 4, wherein the chip stack information generation unit comprises:
   a decoding section configured to decode the chip ID signal and generate the reception enable signal.

6. The semiconductor apparatus according to claim 4, wherein the chip stack information generation unit comprises:

a receiving section configured to receive the chip ID signal transmitted through the common line in response to the reception enable signal and generate the stack information signal.

7. A semiconductor apparatus having sequentially stacked therein three or more chips which include a first chip stacked at a first stage and an other chip stacked at a last stage, wherein each of the three or more chips include chip ID generation units, which are respectively disposed in the three or more chips, are sequentially electrically coupled with one another and generate a plurality of chip ID signals, and wherein the first chip is configured to directly receive the chip ID signal of the other chip and generate a stack information signal from the chip ID signal of the other chip, wherein the semiconductor apparatus further includes a common line which is electrically coupled in common with the three or more chips, wherein each of the three or more chips comprises a chip ID transmission unit which is configured to transmit the chip ID signal of the corresponding chip at a current stage to the common line on the basis of whether a stacked chip exists at a next stage, and wherein the chip ID transmission unit comprises:

a determining section configured to generate a transmission enable signal on the basis of whether an output terminal thereof is electrically coupled with another chip; and a transmitting section configured to transmit the chip ID signal of the chip in which it is disposed, to the common line in response to the transmission enable signal.

8. The semiconductor apparatus according to claim 7, wherein the chip ID transmission unit of the other chip transmits the chip ID signal of the other chip to the common line, and the chip ID transmission units of the remaining chips excluding the other chip block the chip ID signals of the chips in which they are disposed, from being outputted to the common line.

9. The semiconductor apparatus according to claim 7, wherein each of the three or more chips comprises a chip stack information generation unit which is configured to be electrically coupled with the common line and generate a stack information signal from the chip ID signal transmitted through the common line, when it is enabled in response to the chip ID signal of the chip in which it is disposed.

10. The semiconductor apparatus according to claim 9, wherein the chip stack information generation unit comprises:

a decoding section configured to decode the chip ID signal of the chip in which it is disposed, and generate a reception enable signal; and a receiving section configured to receive the chip ID signal transmitted through the common line in response to the reception enable signal and generate the stack information signal.

11. The semiconductor apparatus according to claim 9, wherein the first chip receives the chip ID signal of the other chip which is transmitted through the common line and generates the stack information signal, and the remaining chips of the three or more chips, excluding the first chip, do not generate a stack information signal.

* * * * *